(12) United States Patent
Lee et al.

(10) Patent No.: US 8,187,914 B2
(45) Date of Patent: May 29, 2012

(54) METHODS OF FORMING A PHASE CHANGE MEMORY DEVICE

(75) Inventors: Jin-Il Lee, Seongnam-si (KR); Urazaev Vladimir, Suwon-si (KR); Jin-Ha Jeong, Yongin-si (KR); Seung-Back Shin, Seoul (KR); Sung-Lae Cho, Gwacheon-si (KR); Hyeong-Geun An, Hwaseong-si (KR); Dong-Hyun Im, Hwaseong-si (KR); Young-Lim Park, Hwaseong-si (KR); Jung-Hyeon Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 310 days.

(21) Appl. No.: 12/731,637

(22) Filed: Mar. 25, 2010

(65) Prior Publication Data
US 2010/0248442 A1 Sep. 30, 2010

(30) Foreign Application Priority Data
Mar. 31, 2009 (KR) .................. 10-2009-0027622

(51) Int. Cl.
*H01L 21/20* (2006.01)
(52) U.S. Cl. .......... 438/95; 438/382; 438/385; 438/210; 257/E21.004; 257/E21.068; 257/E21.071
(58) Field of Classification Search ........... 438/385, 438/210, 95, 381, 382; 257/E21.004, E21.068, 257/E21.071
See application file for complete search history.

(56) References Cited

U.S. PATENT DOCUMENTS

| 7,569,417 B2 * | 8/2009 | Lee et al. ................ 438/102 |
| 7,803,654 B2 * | 9/2010 | Lee et al. ................ 438/95 |
| 2007/0246743 A1 * | 10/2007 | Cho et al. ................ 257/202 |
| 2008/0108174 A1 * | 5/2008 | Park et al. ................ 438/102 |

FOREIGN PATENT DOCUMENTS

| KR | 100185643 B1 | 12/1998 |
| KR | 100206714 B1 | 4/1999 |
| KR | 1020060112374 A | 11/2006 |
| KR | 1020080028544 A | 4/2008 |
| KR | 1020080033815 A | 4/2008 |
| KR | 1020080041460 A | 5/2008 |
| KR | 1020080057385 A | 6/2008 |
| WO | WO 2007/133837 A2 | 11/2007 |

* cited by examiner

*Primary Examiner* — Michael Trinh
(74) *Attorney, Agent, or Firm* — Myers Bigel Sibley & Sajovec, PA

(57) ABSTRACT

Provided are methods of forming a phase change memory device. A semiconductor device having a lower electrode and an interlayer insulating layer may be prepared. The lower electrode may be surrounded by the interlayer insulating layer. Source gases, a reaction gas and a purge gas may be injected into a process chamber of a semiconductor fabrication device to form a phase change material layer on a semiconductor substrate. The source gases may be simultaneously injected into the process chamber. The phase change material layer may be in contact with the lower electrode through the interlayer insulating layer. The phase change material layer may be etched to form a phase change memory cell in the interlayer insulating layer. An upper electrode may be formed on the phase change memory cell.

15 Claims, 8 Drawing Sheets

METHODS OF FORMING A PHASE CHANGE MEMORY DEVICE

RELATED APPLICATION DATA

This application claims the benefit of priority under 35 U.S.C. §119 from Korean Patent Application No. 10-2009-0027622, filed on Mar. 31, 2009, the contents of which are hereby incorporated herein by reference in its entirety.

FIELD OF THE INVENTION

Example embodiments relate to methods of forming a phase change memory device.

BACKGROUND

In general, a phase change memory device may be fabricated by forming a resistor to correspond to a phase change memory cell disposed on a semiconductor substrate. The resistor may include a phase-change material. The phase change memory cell may be in contact with a lower electrode at a lower portion of the memory cell, and may be in contact with an upper electrode at an upper portion of the memory cell. The lower electrode may be formed to at least partially fill an opening of a selected interlayer insulating layer. The resistor may fill the opening of the interlayer insulating layer and form the phase change memory cell. As a result, the phase change memory cell may be disposed in the opening to expose the interlayer insulating layer.

The phase change memory cell may not sufficiently fill the opening of the interlayer insulating layer on the lower electrode. This deficiency may result because the resistor is formed using a chemical vapor deposition technique of a semiconductor deposition process. In this case, the chemical vapor deposition technique may generate source gases by vaporizing liquid phase precursors without adjusting the amount of the liquid phase precursors. The source gases may be injected into a process chamber of semiconductor deposition equipment to form materials including germanium (Ge) and tellurium (Te), and materials including antimony (Sb) and tellurium (Te) on the semiconductor substrate.

The materials including Sb and Te are well-known to those of ordinary skill in the art, and have a greater chance of crystallization than materials including Ge and Te at the same temperature. Therefore, because the materials including Sb and Te can be formed without adjusting the amount of the liquid phase precursors, they generally cannot stably undergo chemical reactions with the materials including Ge and Te. The materials including Ge and Te may not have a smooth interface with the materials including Sb and Te. The materials including Ge, Sb and Te may form a void in the resistor.

As a result, the phase change memory cell may not have a desired uniform resistance on the entire surface of the semiconductor substrate. Further, the upper electrode may be formed on the interlayer insulating layer to cover the phase change memory cell. The phase change memory cell may not provide desired electrical bits to a phase change memory device through the lower and upper electrodes.

SUMMARY

Example embodiments provide methods of forming a phase change memory device having a uniform resistance of a phase change memory cell on the entire surface of a semiconductor substrate.

Example embodiments provide methods of forming a phase change memory device capable of generating source gases by adjusting the amount of liquid phase precursors based on a ratio of elements in a phase change material layer. Further, example embodiments provide methods of forming a phase change memory device having a phase change memory cell on a semiconductor substrate by periodically and repeatedly using injection and pause times of a reaction gas during the injection time of source gases.

According to example embodiments, methods of forming a phase change memory device include optionally placing a semiconductor substrate in a process chamber of semiconductor deposition equipment. The semiconductor substrate in the process chamber may be prepared to have an interlayer insulating layer. Further, the interlayer insulating layer may be formed to have an opening. First to third source gases may be injected into the process chamber. The first to third source gases may be simultaneously injected into the process chamber while a semiconductor deposition process is performed. The first source gas may include a germanium (Ge) precursor, the second source gas may include an antimony (Sb) precursor, and the third source gas may include a tellurium (Te) precursor. The reaction gas may be injected into the process chamber during the injection of the first to third source gases. An injection time and a pause time of the reaction gas may be performed repeatedly and periodically during the injection of the first to third source gases. A purge gas may be injected into the process chamber during the injection of the first to third source gases. A phase change material layer may be formed on the interlayer insulating layer using the first to third source gases, the reaction gas and the purge gas. The phase change material layer partially fills the opening.

The injection and pause times of the reaction gas may include one selected from the same interval and different intervals. Each of the injection and pause times of the reaction gas may be performed at least two times.

The first to third source gases together with carrier gases may be injected into the process chamber through first to third gas-injecting inlets disposed on a body of the process chamber. In this instance, the first to third gas-injecting inlets may correspond to the first to third source gases, respectively. Each of the first to third gas-injecting inlets may be connected to a liquid phase precursor reservoir, a liquid flow adjuster and a vaporizer that are sequentially disposed towards the process chamber.

The liquid phase precursor reservoir may have a liquid phase precursor corresponding to one of the first to third source gases. The liquid flow adjuster may receive the liquid phase precursor from the liquid phase precursor reservoir. Further, the liquid flow adjuster may adjust the amount of the liquid phase precursor based on a ratio of elements in the phase change material layer and direct the liquid phase precursor to the vaporizer. The vaporizer may receive the liquid phase precursor from the liquid flow adjuster, vaporize the liquid phase precursor, and generate one source gas. Moreover, the carrier gas may be injected into the vaporizer from the semiconductor deposition equipment to inject the one source gas into the process chamber.

The reaction gas and the purge gas may be injected into the process chamber from the semiconductor deposition equipment through fourth and fifth gas-injection inlets disposed on the body of the process chamber.

The purge gas and the carrier gas may include one selected from $N_2$, He and Ar, or a suitable inert gas. The temperature of the semiconductor substrate may include one selected from 220 to 550° C. while a semiconductor deposition process is performed. In addition, the pressure of the process chamber may include one selected from 1 to 10 Torr.

The method may further include forming a lower electrode partially filling the opening of the interlayer insulating layer. The lower electrode may be formed under the phase change material layer thereby contacting the phase change material layer.

The method may further include forming a phase change memory cell in the opening by etching the phase change material layer to expose the interlayer insulating layer, and forming an upper electrode on the interlayer insulating layer to cover the phase change memory cell.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF THE EMBODIMENTS

Figure 1:
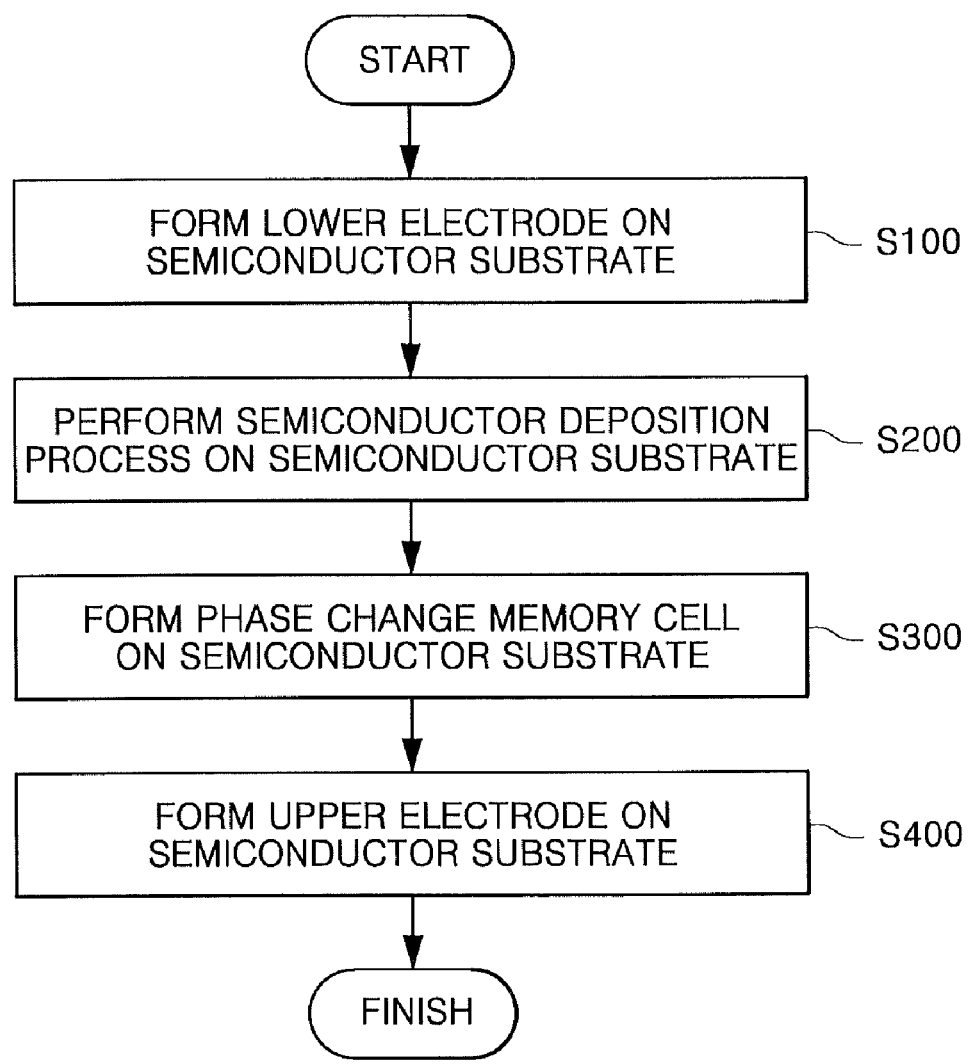
FIG. 1 is a process flow chart illustrating a method of forming a phase change memory device according to example embodiments.

Various example embodiments will now be described more fully with reference to the accompanying drawings in which some example embodiments are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art. In the drawings, the thickness of layers and regions may be exaggerated for clarity. It will be understood that although the terms, such as "a first," "a second" and "a preliminary" and the like, are used herein to describe various elements, the elements should not be limited by these terms. These terms are only used to distinguish one element from another element.

As used herein, "measuring electric resistances of a phase change memory cell" is well-known to one of ordinary skill in the art, and thus a measuring apparatus and a measuring method will not be described in detail. Spatially relative terms, such as "a lower portion," "an upper portion," "under," "over" and the like, may be used herein for ease of description to describe one element or feature's relationship to another element(s) or feature(s) as illustrated in the figures. The terminology used herein is for the purpose of describing particular embodiments only and is not intended to be limiting of the inventive concept.

Methods of forming a phase change memory device according to example embodiments will be described in detail with reference to FIGS. 1 to 8.

Figure 2:
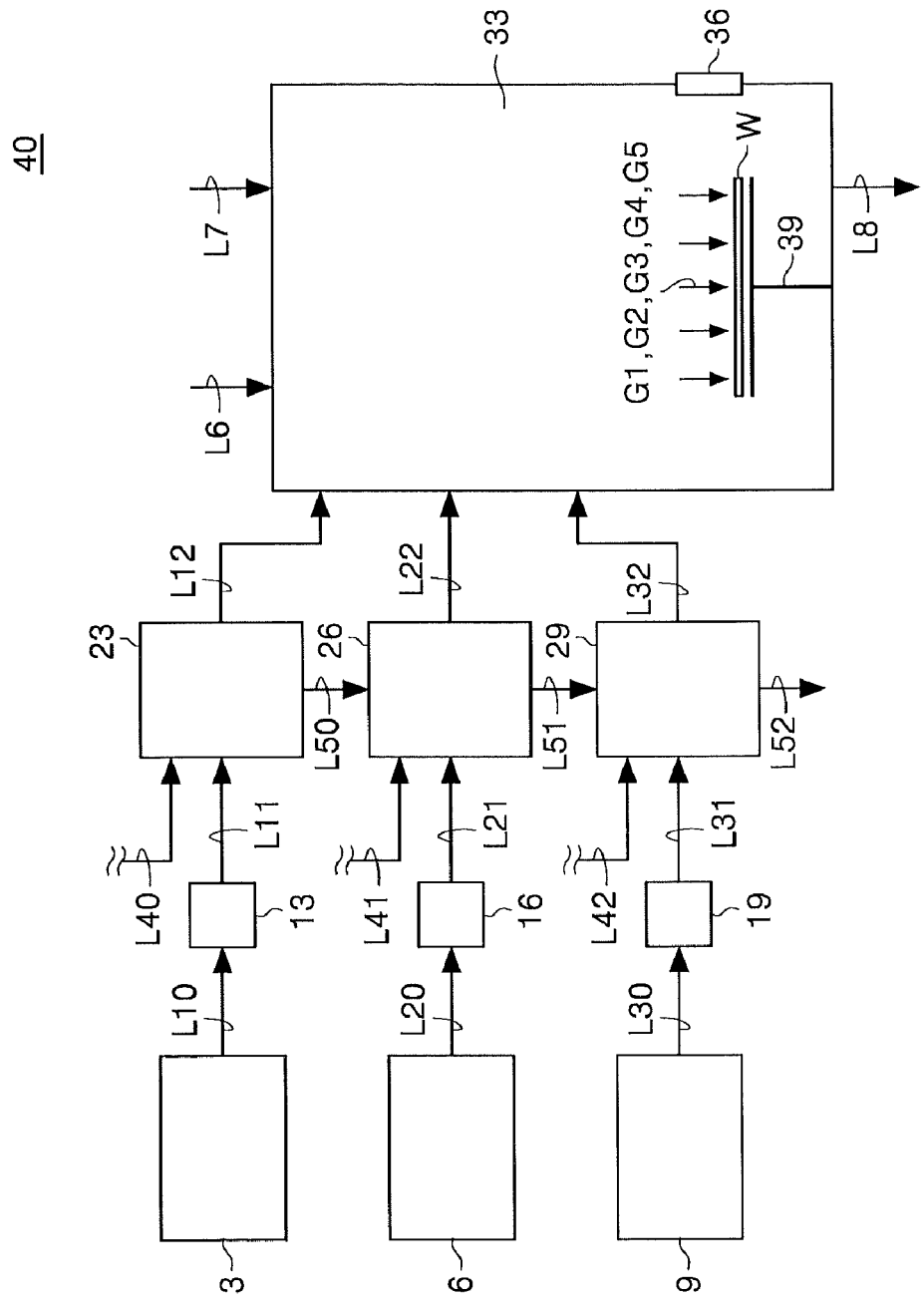
FIG. 2 is a schematic diagram showing semiconductor deposition equipment applied to a semiconductor deposition process of FIG. 1.
Figure 3:
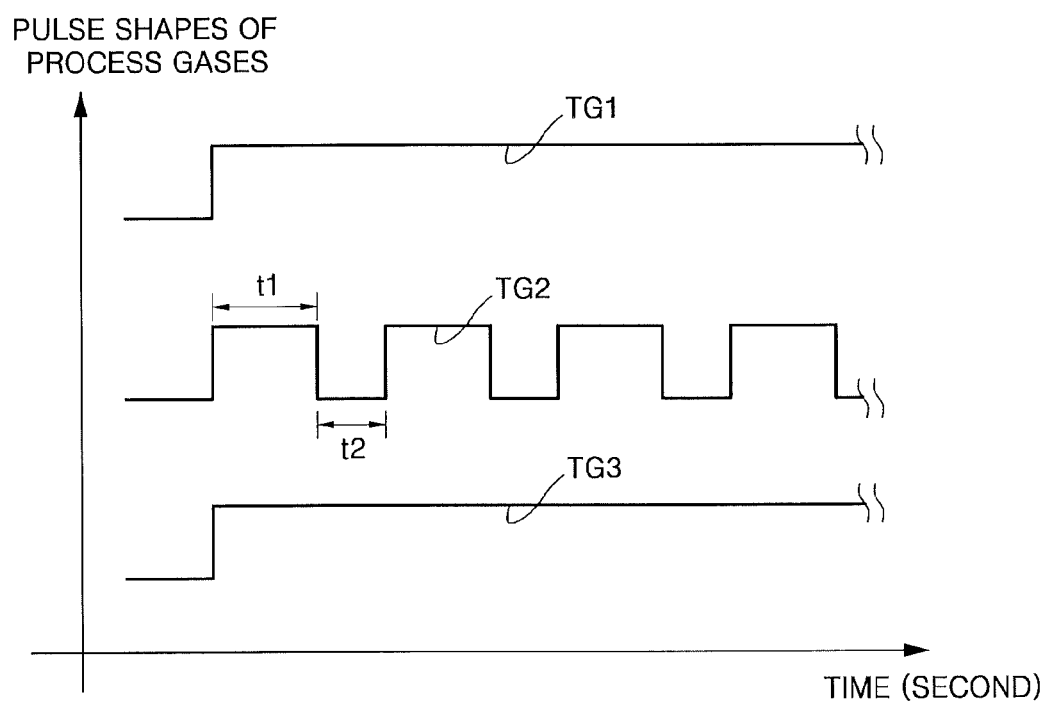
FIG. 3 is a timing graph illustrating pulse shapes of process gases used for a semiconductor deposition process of FIG. 1.

FIG. 1 is a process flow chart illustrating a method of forming a phase change memory device according to example embodiments. FIG. 2 is a schematic diagram and further depicts semiconductor deposition equipment applied to a semiconductor deposition process of FIG. 1. FIG. 3 is a timing graph and further illustrates pulse shapes of process gases used for a semiconductor deposition process of FIG. 1, and FIGS. 4 to 7 are cross-sectional views and further illustrate a method of forming a phase change memory device according to a process flow chart of FIG. 1.

Figure 4:
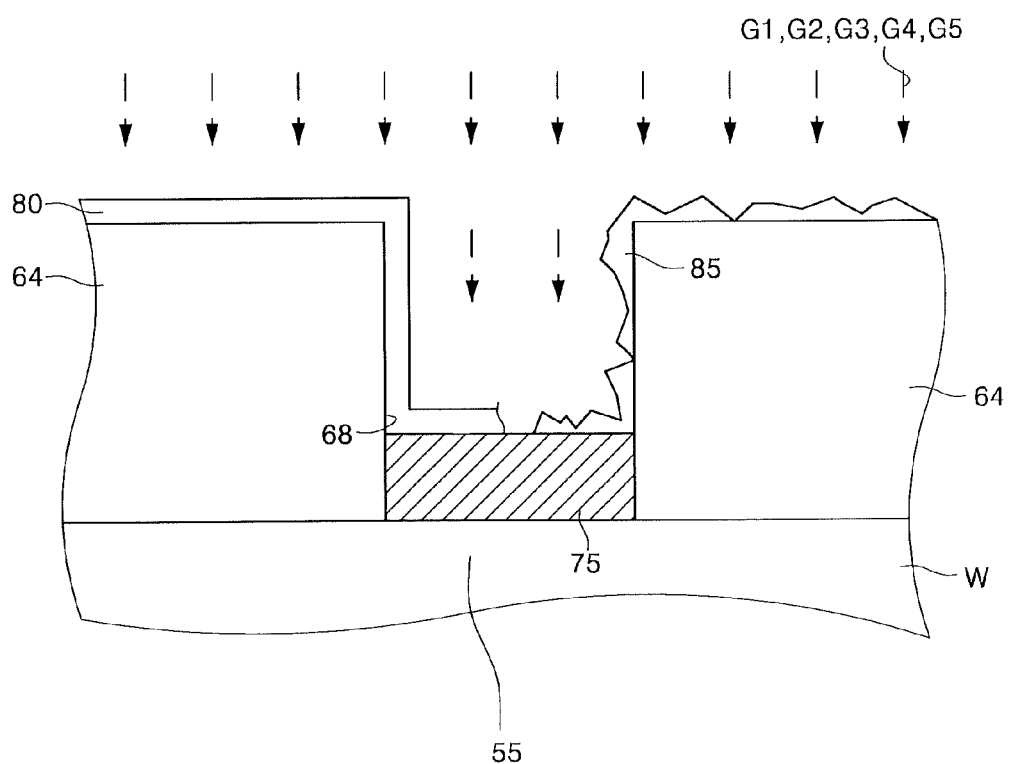
FIGS. 4 to 7 are cross-sectional views illustrating a method of forming a phase change memory device according to a process flow chart of FIG. 1.

Referring to FIGS. 1 to 4, as illustrated in FIG. 4, a lower electrode 75 may be formed on a semiconductor substrate W according to a step S100 in a process flow chart of FIG. 1. For this purpose, the semiconductor substrate W may have an active region 55 as illustrated in FIG. 4. The semiconductor substrate W may have a transistor or a diode (not shown) on the active region 55. The diode may be formed to protrude from the active region 55. An interlayer insulating layer 64 may be formed on the semiconductor substrate W to surround the transistor or the diode.

The interlayer insulating layer 64 may have an opening 68 exposing the transistor or the diode. The lower electrode 75 may be formed in the opening 68 of the interlayer insulating layer 64 as illustrated in FIG. 4. The lower electrode 75 may be formed of a conductive material, e.g., a material including titanium (Ti) elements. The lower electrode 75 may be formed to partially fill the opening 68 of the interlayer insulating layer 64. In some embodiments, the lower electrode 75 may be in contact with a source region or a drain region of the transistor. Alternatively, the lower electrode 75 may be in contact with the diode.

According to a step S200 in the process flow chart of FIG. 1, the semiconductor substrate W may be placed in a process chamber 33 of a semiconductor deposition equipment 40 to perform a semiconductor deposition process on the semiconductor substrate W as illustrated in FIG. 2. According to this embodiment, the semiconductor substrate W may be introduced into the interior of the process chamber 33 through an entrance of the process chamber 22 to be mounted on a support part 39 of the process chamber 33. The semiconductor deposition equipment 40 may employ a chemical vapor deposition technique during the semiconductor deposition process. The semiconductor deposition equipment 40 may have first to third gas-injecting inlets (not shown) on a body of the process chamber 33.

The first gas-injecting inlet may be connected to a first liquid phase precursor reservoir 3, a first liquid flow adjuster 13, and a first vaporizer 23 as illustrated in FIG. 2. The first liquid phase precursor reservoir 3 may have a first liquid phase precursor. The first liquid phase precursor may be a germanium (Ge) precursor in a liquid phase. The first liquid phase precursor reservoir 3 may be filled with the first liquid phase precursor by the semiconductor deposition equipment 40 or an operator of the semiconductor deposition equipment.

The first liquid flow adjuster 13 may receive the first liquid phase precursor from the first liquid phase precursor reservoir 3 through the semiconductor deposition equipment. The first liquid flow adjuster 13 may adjust the amount of first liquid phase precursors based on a ratio of elements in a desired phase change material layer to send the first liquid phase precursor to the first vaporizer 23. The first vaporizer 23 may receive the first liquid phase precursor from the first liquid flow adjuster 13 and vaporize the first liquid phase precursor to generate a first source gas G1. The first source gas G1 may be a Ge precursor in a gaseous phase.

According to this embodiment, the first liquid phase precursor reservoir 3, the first liquid flow adjuster 13, the first vaporizer 23 and the process chamber 33 may have first lines L10, L11, and L12 there between as illustrated in FIG. 2. The first lines L10, L11 and L12 may transmit the first liquid phase precursor and the first source gas G1 from the first liquid phase precursor reservoir 3 to the first liquid flow adjuster 13, the first vaporizer 23 and the process chamber 33, as mentioned above. A line L10 of the first lines L10, L11 and L12 may have a first on/off valve between the first liquid phase precursor reservoir 3 and the first liquid flow adjuster 13.

The first on/off valve may connect the first liquid phase precursor reservoir 3 to the first liquid flow adjuster 13 through the line L10 while a semiconductor deposition process is performed. The first on/off valve may shield the first liquid phase precursor reservoir 3 and the first liquid flow adjuster 13 through the line L10 when the semiconductor deposition process is completed. Further, the second gas-injecting inlet may be connected to a second liquid phase precursor reservoir 6, a second liquid flow adjuster 16 and a second vaporizer 26 as illustrated in FIG. 2.

The second liquid phase precursor reservoir 6, the second liquid flow adjuster 16 and the second vaporizer 26 may have the same structure and function as the first liquid phase precursor reservoir 3, the first liquid flow adjuster 13 and the first vaporizer 23. According to this embodiment, the second liquid phase precursor reservoir 6 may have a second liquid phase precursor. The second liquid phase precursor may be an antimony (Sb) precursor in a liquid phase. The second vaporizer 26 may generate a second source gas G2 using the second liquid phase precursor. The second source gas G2 may be an Sb precursor in a gaseous phase.

The second liquid phase precursor reservoir 6, the second liquid flow adjuster 16, the second vaporizer 26 and the process chamber 33 may have second lines L20, L21 and L22 and second on/off valves there between as illustrated in FIG. 2. The second lines L20, L21 and L22 and the second on/off valves may have the same structure and function as the first lines L10, L11 and L12 and the first on/off valves. Furthermore, the third gas-injecting inlet may be connected to a third liquid phase precursor reservoir 9, a third liquid flow adjuster 19 and a third vaporizer 29 as illustrated in FIG. 2.

The third liquid phase precursor reservoir 9, the third liquid flow adjuster 19 and the third vaporizer 29 may have the same structure and function as the second liquid phase precursor reservoir 6, the second liquid flow adjuster 16 and the second vaporizer 26. According to this embodiment, the third liquid phase precursor reservoir 9 may have a third liquid phase precursor. The third liquid phase precursor may be a tellurium (Te) precursor in a liquid phase. The third vaporizer 29 may generate a third source gas G3 using the third liquid phase precursor. The third source gas G3 may be a Te precursor in a gaseous phase. The third liquid phase precursor reservoir 9, the third liquid flow adjuster 19, the third vaporizer 29 and the process chamber 33 may have third lines L30, L31 and L32 and third on/off valves there between as illustrated in FIG. 2.

The third lines L30, L31 and L32 and the third on/off valves may have the same structure and function as the second lines L20, L21 and L22 and the second on/off valves. The first to third vaporizers 23, 26 and 29 may be connected to fourth lines L40, L41, and L42 as illustrated in FIG. 2. The fourth lines L40, L41, and L42 may inject a carrier gas into the first to third vaporizers 23, 26 and 29 from the semiconductor deposition equipment. The carrier gas may enable the first to third source gases G1, G2 and G3 of the first to third vaporizers 23, 26, and 29 to be injected into the process chamber 33 while the semiconductor deposition process is performed.

The first to third source gases G1, G2, and G3 may be injected into the process chamber 33 according to a first line TG1 in a timing graph of FIG. 3. As a result, the first to third source gases G1, G2, and G3 may be simultaneously injected into the process chamber 33 while the semiconductor deposition process is performed. The first to third source gases G1, G2, and G3 may correspond to Ge, Sb and Te precursors, respectively. The Ge precursor may include one selected from $Ge(i-Pr)_3H$, $GeCl_4$, $Ge(Me)_4$, $Ge(Me)_4N_3$, $Ge(Et)_4$, $Ge(Me)_3NEt_2$, $Ge(i-Bu)_3H$, $Ge(nBu)_4$, $Sb(GeEt_3)_3$ and $Ge(C_p)_2$.

The Sb precursor may include one selected from $Sb(iBu)_3$, $SbCl_3$, $SbCl_5$, $Sb(Me)_3$, $Sb(Et)_3$, $Sb(iPr)_3$, $Sb(tBu)_3$, $Sb[N(Me)_2]_3$ and $Sb(Cp)_3$. The Te precursor may include one selected from $Te(iBu)_2$, $TeCl_4$, $Te(Me)_2$, $Te(Et)_2$, $Te(nPr)_2$, $Te(iPr)_2$ and $Te(tBu)_2$. Meanwhile, a reaction gas G4 and a purge gas G5 together with the first to third source gases G1, G2, and G3 may be injected into the process chamber 33. The reaction gas G4 may be injected into the process chamber 33 through a sixth line L6 connected to a fourth gas-injecting inlet of the body of the process chamber 33. The reaction gas G4 may be injected into the process chamber 33 according to a second line TG2 in the timing graph of FIG. 3.

The reaction gas G4 may be one selected from $H_2$, $NH_3$, $N_2H_4$, $SiH_4$, $B_2O_6$, $O_2$, $O_3$ and $H_2O$. The reaction gas G4 may be injected into the process chamber 33 by periodically and repeatedly using an injection time t1 and a pause time t2 during the injection time of the first to third source gases G1, G2, and G3. The injection time t1 and the pause time t2 of the reaction gas G4 may include one selected from the same interval and different intervals. Each of the injection time t1 and the pause time t2 of the reaction gas G4 may be performed at least two times. The injection time t1 of the reaction gas G4 may include one selected from a range of 0.1 to 1.0 seconds. The pause time t2 of the reaction gas G4 may include one selected from a range of 0.1 to 1.0 seconds.

The purge gas G5 may be injected into the process chamber 33 through a seventh line L7 connected to a fifth gas-injecting inlet of the body of the process chamber. The purge gas G5 may be injected into the process chamber 33 according to a third line TG3 in the timing graph of FIG. 3. As a result, the purge gas 05 may be injected into the process chamber 33 during injection time of the first to third source gases G1, G2, and G3. The first to third source gases G1, G2, and G3 and the reaction gas G4 perform a vapor reaction over the semiconductor substrate W while the semiconductor deposition process is performed, so that reactive materials may be deposited on the semiconductor substrate W.

The purge gas G5 may remove the first to third source gases G1, G2, and G3 and the reaction gases G4, which do not contribute to the vapor reaction, from the process chamber 33 while the semiconductor deposition process is performed. The reactive materials according to the example embodiments will be described with reference to the left region of FIG. 4 showing an opening 68 and an interlayer insulating layer 64 defining the left region as shown in FIG. 4. The reactive materials according to the example embodiments may allow a first preliminary phase change material layer 80 to be formed on a bottom surface and a sidewall of the opening 68 and on a top surface of the interlayer insulating layer 64.

The first preliminary phase change material layer 80 according to the example embodiments may be formed on the interlayer insulating layer 64 to conformally cover the bottom surface and the sidewall of the opening 68. The first preliminary phase change material layer 80 according to the example embodiments is formed by adjusting the amount of the first to third source gases G1, G2, and G3 using the first to third liquid flow adjusters 13, 16 and 19 of FIG. 2. That is, the first to third liquid flow adjusters 13, 16 and 19 may adjust the amount of the first to third source gases G1, G2, and G3 based on a ratio of elements constituting a desired phase change material layer.

In addition, the vapor reaction of the first to third source gases G1, G2, and G3 may be adjusted through the injection time t1 and the pause time t2 of the reaction gas. As a result, the first preliminary phase change material layer 80 may be formed by adjusting a crystallization rate of materials including Sb and Te and/or adjusting the volume subject to crystallization. Therefore, the first preliminary phase change material layer 80 may be formed with smooth interfaces maintained between materials including Ge and Te and materials including Sb and Te.

A surface defining the first preliminary phase change material layer 80 according to the example embodiments may have a smooth surface as well. In contrast, reactive materials according to a conventional art will be described with reference to the region on the right of FIG. 4, the opening and the interlayer insulating layer 64 defining the right region as shown in FIG. 4. The reactive materials according to the conventional art may allow a first preliminary phase change material layer 85 to be formed on a bottom surface and a sidewall of the opening 68 and on the interlayer insulating layer 64. A first preliminary phase change material layer 85 according to the conventional art may not have smooth interfaces between materials including Ge and Te and materials including Sb and Te.

Semiconductor deposition equipment according to the conventional art typically does not include first to third liquid flow adjusters 13, 16, and 19 of the example embodiments. As a result, the first preliminary phase change material layer 85 according to the conventional art may not be formed by adjusting a crystallization rate of materials including Sb and Te and/or their volumes subject to crystallization. Therefore, a surface defining the first preliminary phase change material layer 85 according to the conventional art may not have a smooth surface. While the first preliminary phase change material layer 80 according to the example embodiments is formed, the purge gas G5 may remove the first to third source gases G1, G2, and G3 and the reaction gas G4 that do not contribute to the vapor reaction from the process chamber 33 through an eighth line L8 of FIG. 2.

The purge gas G5 together with the carrier gas may include one selected from $N_2$, He and Ar, or a suitable inert gas. The temperature of the semiconductor substrate W may include one selected from 220 to 550° C. while the semiconductor deposition process is performed. Moreover, the pressure of the process chamber 33 may include one selected from 1 to 10 Torr.

Figure 5:
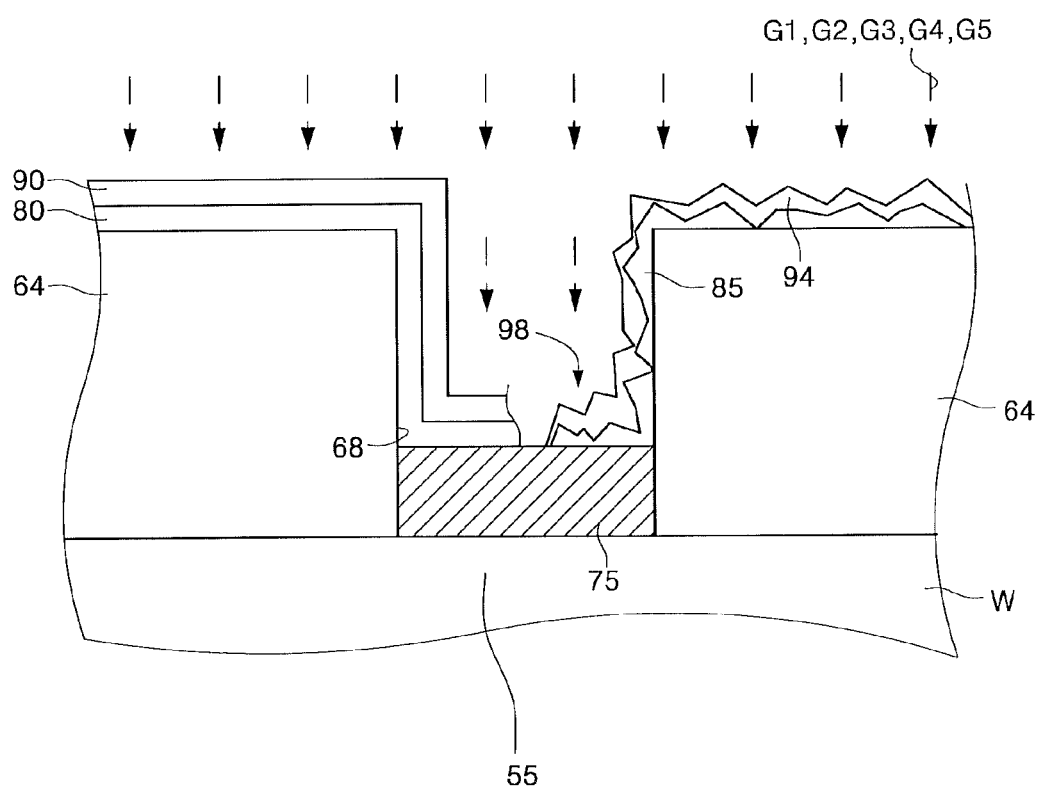

Referring to FIGS. 1, 2, 3 and 5, a second preliminary phase change material layer 90 may be continuously formed on the semiconductor substrate W according to the step S200 in the process flow chart of FIG. 1 as illustrated in FIG. 5. The second preliminary phase change material layer 90 according to the example embodiments may be conformally formed on the first preliminary phase change material layer 80 according to the example embodiments. The second preliminary phase change material layer 90 is formed by adjusting the amount of the first to third source gases G1, G2 and G3 of FIG. 2 based on the ratio of the elements constituting the desired phase change material layer.

Therefore, a surface defining the second preliminary phase change material layer 90 according to the example embodiments may be as smooth as that of the first preliminary phase change material layer 80 according to the example embodiments. In contrast, a second preliminary phase change material layer 94 according to the conventional art may not be conformally formed on the first preliminary phase change material layer 85 according to the conventional art as illustrated in FIG. 5. The second preliminary phase change material layer 94 according to the conventional art is not formed by adjusting the amount of the first to third source gases G1, G2, and G3 based on the ratio of the elements constituting the desired phase change material layer.

Further, the second preliminary phase change material layer 94 according to the conventional art is formed on a rough surface of the first preliminary phase change material layer 85 according to the conventional art, and thus, it may have concave and/or convex configurations according to the shape of a lower structure. As a result, a surface defining the second preliminary phase change material layer 94 according to the conventional art may not have a smooth surface such as that of the first preliminary phase change material layer 85 according to the conventional art. Therefore, the second preliminary phase change material layer 94 according to the conventional art may have a void-forming region 98 defined as the surface of the second preliminary phase change material layer 94.

While the second preliminary phase change material layer 90 according to the example embodiments is formed, the purge gas 05 may remove the first to third source gases G1, G2, and G3 and the reaction gas G4 that do not contribute to the vapor reaction from the process chamber 33 through the eighth line L8 of FIG. 2.

Figure 6:
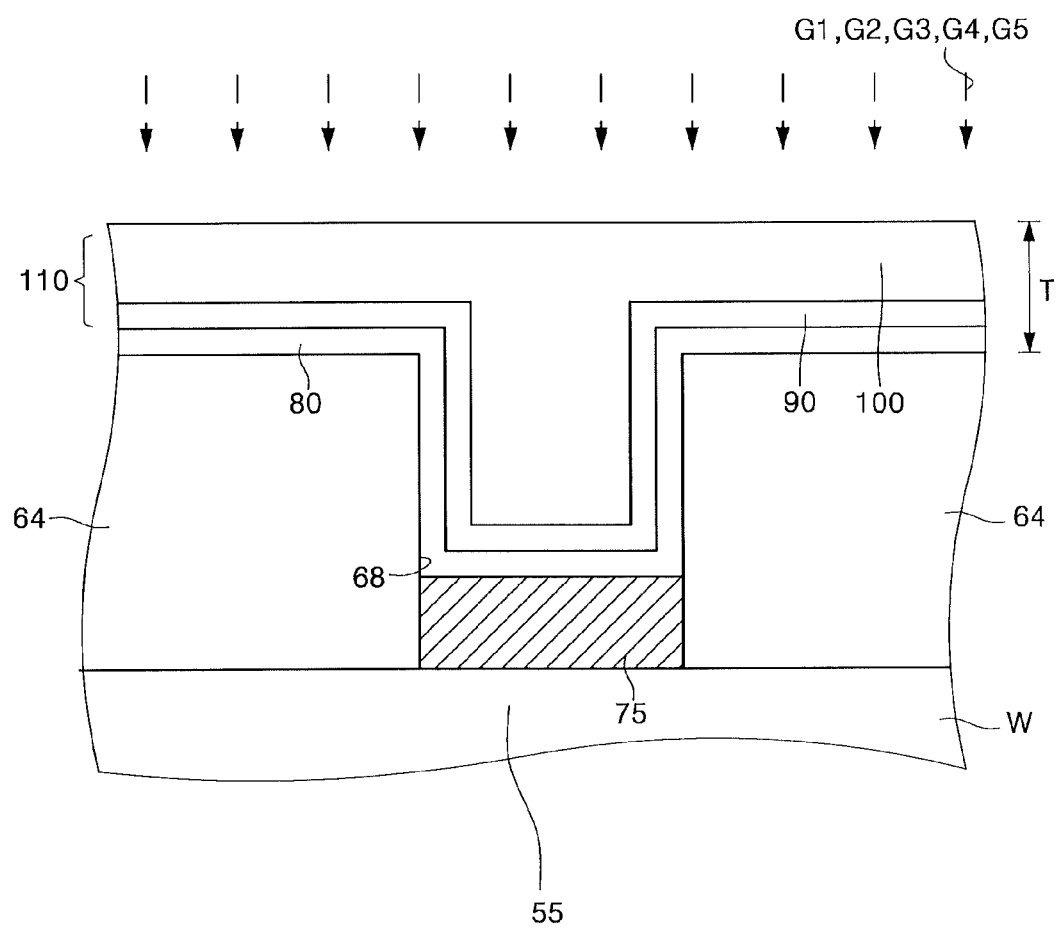

Referring to FIGS. 1, 2, 3 and 6, a third preliminary phase change material layer 100 may be formed on the second preliminary phase change material layer 90 according to the step S200 in the process flow chart of FIG. 1, as illustrated in FIG. 6. The third preliminary phase change material layer 100 according to the example embodiments may be formed by adjusting the amount of the first to third source gases G1, G2 and G3 of FIG. 2 based on the ratio of the elements constituting the desired phase change material layer according to FIG. 4 and/or FIG. 5. According to this embodiment, the amount of the first to third source gases G1, G2 and G3 may be estimated in advance and adjusted by the first to third liquid flow adjusters 13, 16, and 19 of FIG. 2.

While the third preliminary phase change material layer 100 according to the example embodiments is formed, the purge gas G5 of FIG. 2 may remove the first to third source gases G1, G2, and G3 and the reaction gas G4 that do not contribute to the vapor reaction from the process chamber 33 through the eighth line L8 of FIG. 2. The first to third preliminary phase change material layers 80, 90, and 100 may constitute a desired phase change material layer 110. The desired phase change material layer 110 may be formed to a predetermined thickness T to fill the opening 68 of the interlayer insulating layer 64 and cover the top surface of the interlayer insulating layer 64.

After the desired phase change material layer 110 is formed, the first to third vaporizers 23, 26, and 29 of the semiconductor deposition equipment 40 of FIG. 2 may discharge the first to third source gases G1, G2 and G3 to a release means, such as a pumping means (not shown), through the fifth lines L50, L51, and L52. In this embodiment, the first to third on/off valves may shield the first to third lines L10, L20 and L30 between the first to third liquid phase precursor reservoirs 3, 6 and 9 and the first to third liquid flow adjusters 13, 16, and 19.

Furthermore, the semiconductor deposition equipment 40 may discharge the first to third source gases G1, G2 and G3, the reaction gas G4 and the purge gas G5 from the process chamber through the eighth line L8 of the process chamber 33.

Figure 7:
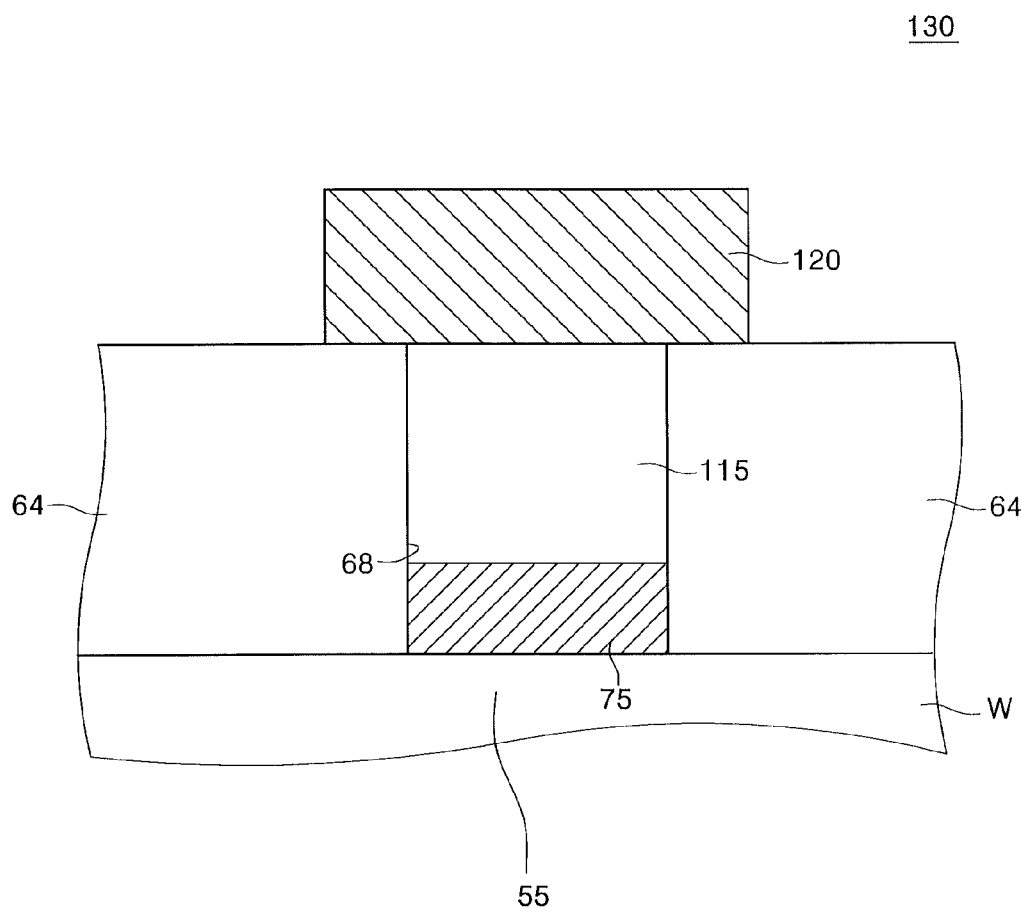

Referring to FIGS. 1 and 7, a phase change memory cell 115 may be formed on the semiconductor substrate W according to a step S300 in the process flow chart of FIG. 1 as illustrated in FIG. 7. According to this embodiment, the phase change memory cell 115 may be formed in the opening 68 by etching the desired phase change material layer 110 of FIG. 6 to expose the interlayer insulating layer 64. The phase change memory cell 115 according to the example embodiments does not have the void-forming region 98 of FIG. 5, and thus, it does not have a void in the opening 68.

In contrast, the phase change memory cell according to the conventional art includes the void-forming region 98 of FIG. 5, and thus, it may have a void in the opening 68. Further, an upper electrode 120 may be formed on the semiconductor substrate W according to a step S400 in the process flow chart of FIG. 1. The upper electrode 120 may be formed on the interlayer insulating layer 64 to cover the phase change memory cell 115. The upper electrode 120 may be formed of a conductive material, e.g., a material including Ti elements. As a result, the upper electrode 120 may constitute a phase change memory device 130 according to the example embodiments, together with the lower electrode 75 and the phase change memory cell 115.

Figure 8:
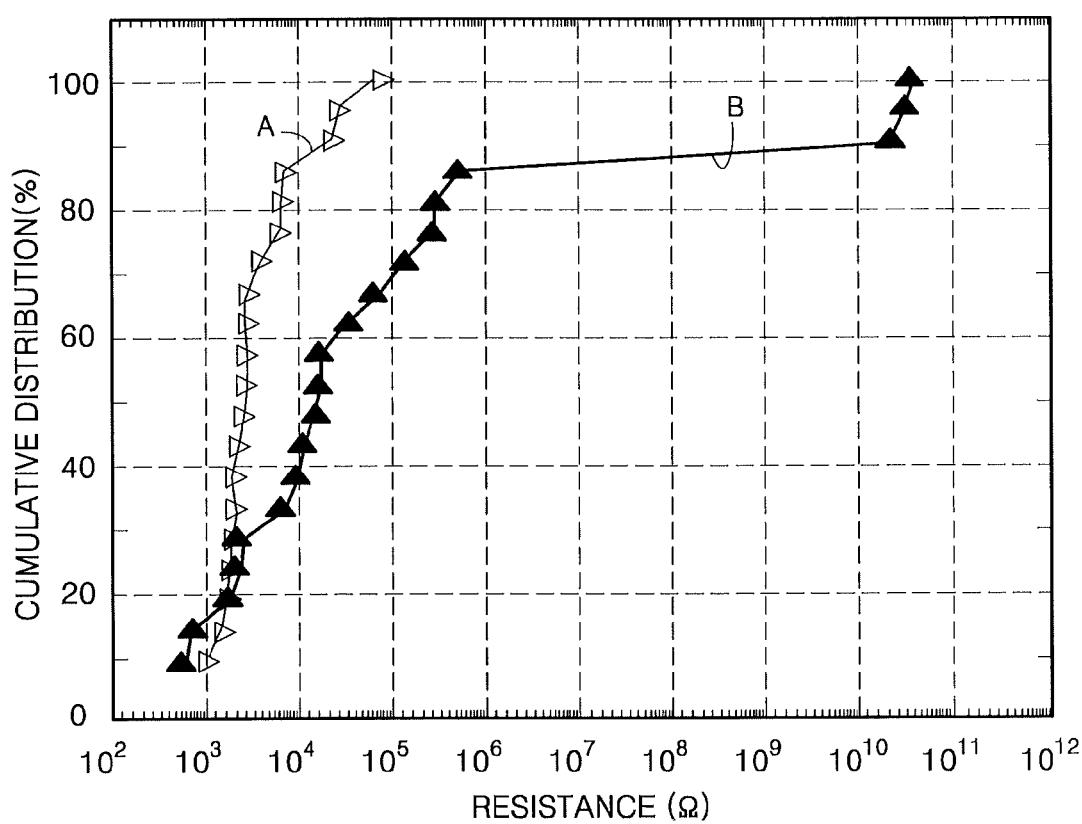
FIG. 8 is a graph showing resistances of phase change memory cells according to example embodiments and a method according to the conventional art on an entire surface of a semiconductor substrate.

FIG. 8 is a graph showing resistances of phase change memory cells according to example embodiments and the conventional art on an entire surface of a semiconductor substrate.

Referring to FIG. 8, a first semiconductor substrate having lower electrodes, phase change memory cells A and upper electrodes is prepared according to the example embodiments. A second semiconductor substrate having lower electrodes, phase change memory cells B and upper electrodes is prepared according to a method of the conventional art. Electric resistances of the phase change memory cells A and B are measured through the lower and upper electrodes on the first and second semiconductor substrates. The electric resistances of the phase change memory cells A and B are illustrated in the graph shown in FIG. 8, in which a resistance value is plotted on the X axis and cumulative distribution (%) is plotted on the Y axis.

The cumulative distribution (%) may be a sum of measured positions distributed on the entire surfaces of the first and second semiconductor substrates. As shown in FIG. 8, according to this embodiment, the phase change memory cells A have uniform resistances on the entire surface of the first semiconductor substrate up to a cumulative distribution of 90%. As a result, the resistances of the phase change memory cells A may demonstrate that the openings 68 of the interlayer insulating layer 64 of FIG. 7 does not have voids therein. In contrast, the phase change memory cells B have different resistances from one another on the entire surface of the second semiconductor substrate.

As a result, the resistances of the phase change memory cells B may demonstrate that the openings 68 of the interlayer insulating layer 64 of FIG. 7 has voids therein. The voids have different sizes from one another in the openings 68 of the second semiconductor substrate and have air therein.

As described above, example embodiments can provide methods of forming a phase change memory device that does not have significant voids in a phase change memory cell filling an opening of an interlayer insulating layer. As a result, a phase change memory cell according to the example embodiments can stably provide electric bits to the phase change memory device compared with the conventional phase change memory cell.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of forming a phase change memory device, comprising:
    injecting first to third source gases into a process chamber of a semiconductor deposition apparatus, wherein the first to third source gases are simultaneously injected into the process chamber while a semiconductor deposition process is performed, the first source gas comprises a germanium (Ge) precursor, the second source gas comprises an antimony (Sb) precursor, and the third source gas comprises a tellurium (Te) precursor;
    injecting a reaction gas into the process chamber during the injection of the first to third source gases, wherein an injection time and a pause time of the reaction gas are performed repeatedly and periodically during the injection of the first to third source gases;
    injecting a purge gas into the process chamber during the injection of the first to third source gases; and
    forming a phase change material layer on a interlayer insulating layer of a semiconductor substrate disposed in the semiconductor deposition apparatus using the first to third source gases, the reaction gas and the purge gas, wherein the interlayer insulating layer has an opening and the phase change material layer partially fills the opening.

2. The method of claim 1, wherein the Ge precursor is selected from the group consisting of $Ge(i-Pr)_3H$, $GeCl_4$, $Ge(Me)_4$, $Ge(Me)_4N_3$, $Ge(Et)_4$, $Ge(Me)_3NEt_2$, $Ge(i-Bu)_3H$, $Ge(nBu)_4$, $Sb(GeEt_3)_3$ and $Ge(Cp)_2$.

3. The method of claim 2, wherein the Sb precursor is selected from the group consisting of $Sb(iBu)_3$, $SbCl_3$, $SbCl_5$, $Sb(Me)_3$, $Sb(Et)_3$, $Sb(iPr)_3$, $Sb(tBu)_3$, $Sb[N(Me)_2]_3$ and $Sb(Cp)_3$.

4. The method of claim 3, wherein the Te precursor is selected from the group consisting of $Te(iBu)_2$, $TeCl_4$, $Te(Me)_2$, $Te(Et)_2$, $Te(nPr)_2$, $Te(iPr)_2$ and $Te(tBu)_2$.

5. The method of claim 4, wherein the injection and pause times of the reaction gas are of the same interval or different intervals.

6. The method of claim 5, wherein each of the injection and pause times of the reaction gas is performed at least two times.

7. The method of claim 6, wherein the injection time of the reaction gas is a time period in a range from about 0.1 to 1.0 seconds.

8. The method of claim 7, wherein the pause time of the reaction gas is a time period in a range from about 0.1 to 1.0 seconds.

9. The method of claim 8, wherein the reaction gas is selected from the group consisting of $H_2$, $NH_3$, $N_2H_4$, $SiH_4$, $B_2O_6$, $O_2$, $O_3$ and $H_2O$.

10. The method of claim 9, wherein the first to third source gases together with at least one carrier gas is injected into the process chamber through first to third gas-injecting inlets disposed on a body of the process chamber,
wherein the first to third gas-injecting inlets correspond to the first to third source gases, respectively, and each of the first to third gas-injecting inlets is connected to a liquid phase precursor reservoir, a liquid flow adjuster and a vaporizer that are sequentially disposed towards the process chamber,
wherein the liquid phase precursor reservoir comprises holds a liquid phase precursor corresponding to one of the first to third source gases, the liquid flow adjuster receives the liquid phase precursor from the liquid phase precursor reservoir, adjusts the amount of the liquid phase precursor based on a ratio of elements in the phase change material layer and conveys the liquid phase precursor to the vaporizer, the vaporizer receives the liquid phase precursor from the liquid flow adjuster, vaporizes the liquid phase precursor, and generates a source gas, and the carrier gas is injected into the vaporizer from the semiconductor deposition apparatus to inject the source gas into the process chamber.

11. The method of claim 10, wherein the reaction gas and the purge gas are injected into the process chamber from the semiconductor deposition apparatus through fourth and fifth gas-injecting inlets disposed on the body of the process chamber.

12. The method of claim 11, wherein the purge gas and the carrier gas are independently selected from the group consisting of $N_2$, He and Ar.

13. The method of claim 12, wherein a temperature of the semiconductor substrate is in a range from about 220 to 550° C. while a semiconductor deposition process is performed, and the pressure of the process chamber is in a range from about 1 to 10 Torr.

14. The method of claim 13, further comprising forming a lower electrode partially filling the opening of the interlayer insulating layer,
wherein the lower electrode is formed under the phase change material layer to contact the phase change material layer.

15. The method of claim 14, further comprising:
forming a phase change memory cell in the opening by etching the phase change material layer to expose the interlayer insulating layer; and
forming an upper electrode on the interlayer insulating layer to cover the phase change memory cell.

* * * * *